United States Patent
Li et al.

(10) Patent No.: US 7,023,003 B2
(45) Date of Patent: Apr. 4, 2006

(54) ION IMPLANTER AND METHOD OF PREVENTING UNDESIRABLE IONS FROM IMPLANTING A TARGET WAFER

(75) Inventors: Chen-Chung Li, Taichung (TW); Jui-Chun Weng, Jhongshan District (TW); Chi-Chieh Wang, Taoyuan County (TW); Tai-Kun Kao, Hsinchu (TW)

(73) Assignee: Taiwan Semiconductor Manufacturing Co., Ltd., HsinChu (TW)

( * ) Notice: Subject to any disclaimer, the term of this patent is extended or adjusted under 35 U.S.C. 154(b) by 36 days.

(21) Appl. No.: 10/804,890

(22) Filed: Mar. 18, 2004

(65) Prior Publication Data

US 2005/0205808 A1 Sep. 22, 2005

(51) Int. Cl.
*H01J 37/00* (2006.01)
*H01J 37/08* (2006.01)
*H01J 37/20* (2006.01)

(52) U.S. Cl. ............... 250/492.21; 250/492.1; 250/492.2; 250/492.3; 250/281; 250/282

(58) Field of Classification Search ........... 250/492.21, 250/492.2, 492.1, 492.3, 281, 282, 396 ML, 250/396 R, 423 R, 505.1
See application file for complete search history.

(56) References Cited

U.S. PATENT DOCUMENTS

| 4,757,198 | A | * | 7/1988 | Korte et al. ............. 250/288 |
| 4,899,059 | A | * | 2/1990 | Freytsis et al. ........... 250/492.2 |
| 5,134,301 | A | * | 7/1992 | Kamata et al. ........... 250/492.2 |
| 5,244,820 | A | * | 9/1993 | Kamata et al. ............. 438/514 |
| 5,313,061 | A | * | 5/1994 | Drew et al. .................. 250/281 |
| 6,177,679 | B1 | * | 1/2001 | Byun et al. ............ 250/492.21 |
| 6,670,624 | B1 | * | 12/2003 | Adams et al. ......... 250/492.21 |
| 6,696,689 | B1 | * | 2/2004 | Chen ...................... 250/423 R |
| 2003/0030006 | A1 | * | 2/2003 | Chen .......................... 250/379 |
| 2003/0160179 | A1 | * | 8/2003 | Yeh et al. ............... 250/423 R |
| 2004/0188631 | A1 | * | 9/2004 | Horsky et al. .......... 250/423 R |
| 2004/0245476 | A1 | * | 12/2004 | Horsky et al. .......... 250/423 R |

* cited by examiner

*Primary Examiner*—John R. Lee
*Assistant Examiner*—Bernard E. Souw
(74) *Attorney, Agent, or Firm*—Tung & Associates

(57) ABSTRACT

An ion implanter is provided having an ion source; an AMU analyzing magnet having a fixed radius $R_{am}$; an ion extraction voltage source; a communication interface for monitoring implantation parameters; and an equipment server having a data log. The ion implanter further has an arithmetic processor capable of determining a real-time estimated radius $R_e$ of a circular path of ions being implanted into a target wafer. A method of using the ion implanter provide an interlock on an AMU of each of a plurality of ions being implanted into the target wafer. The method has the step of determining in real-time if an ion implanter is implanting a desired ion into a target wafer. Also, the method determines if an absolute value of an offset between the $R_{am}$ and $R_e$ exceeds a predetermined radius tolerance level L and adjusts the implanter accordingly if L is exceeded.

13 Claims, 3 Drawing Sheets

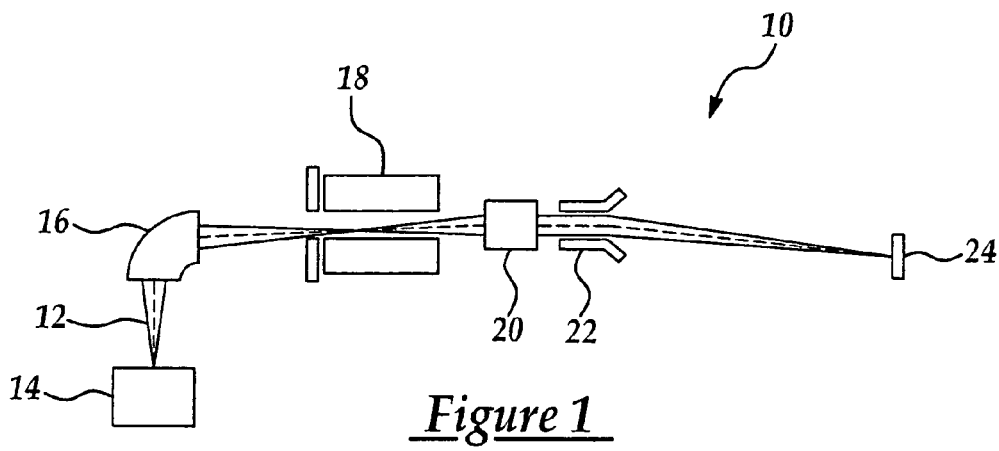
*Figure 1*
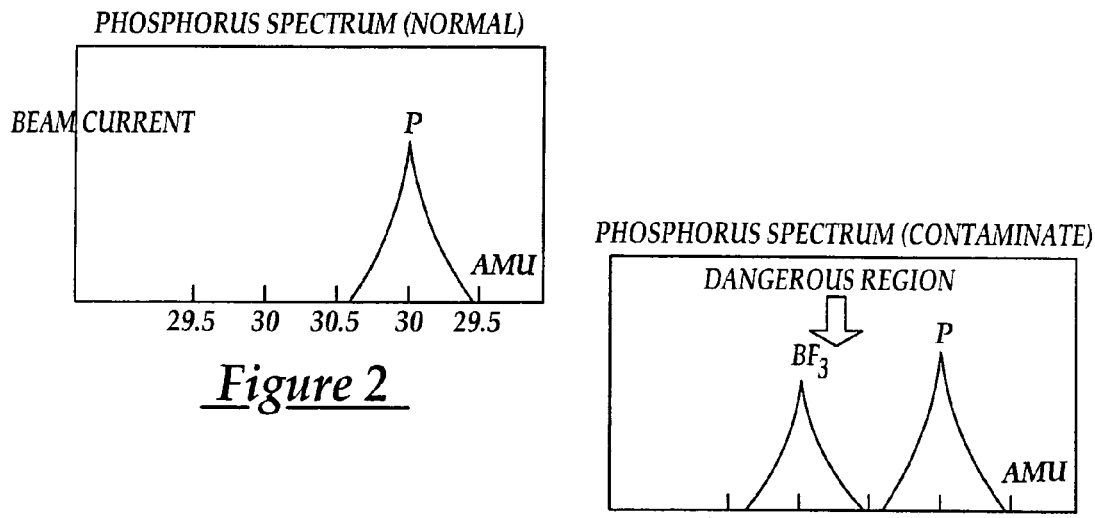
*Figure 2*
*Figure 3*
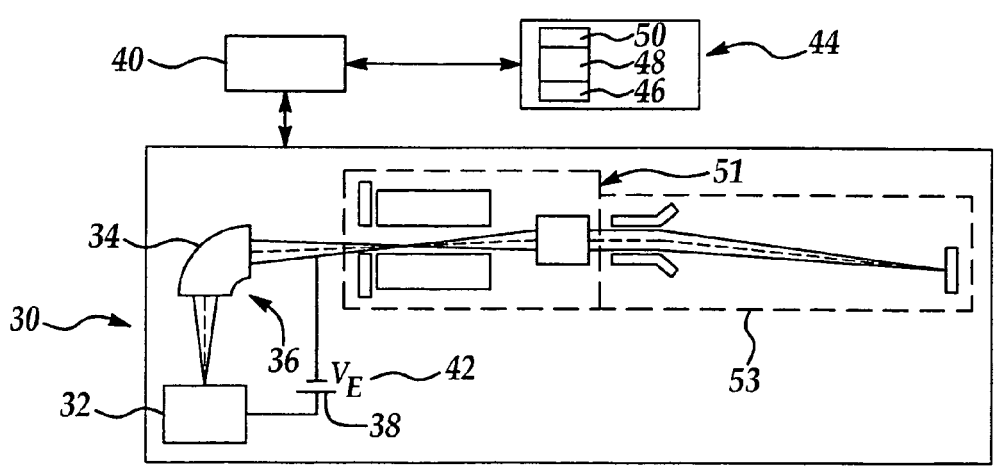
*Figure 4*

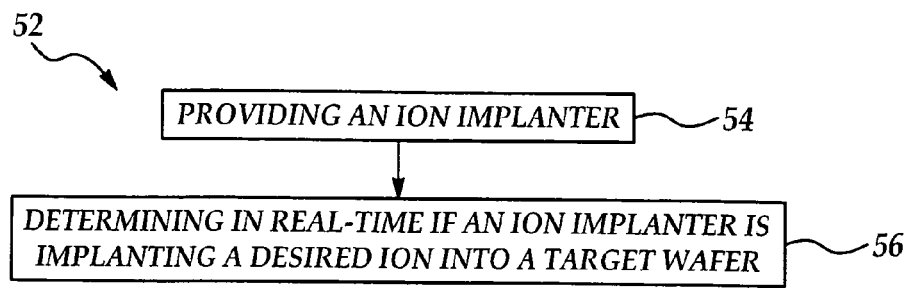
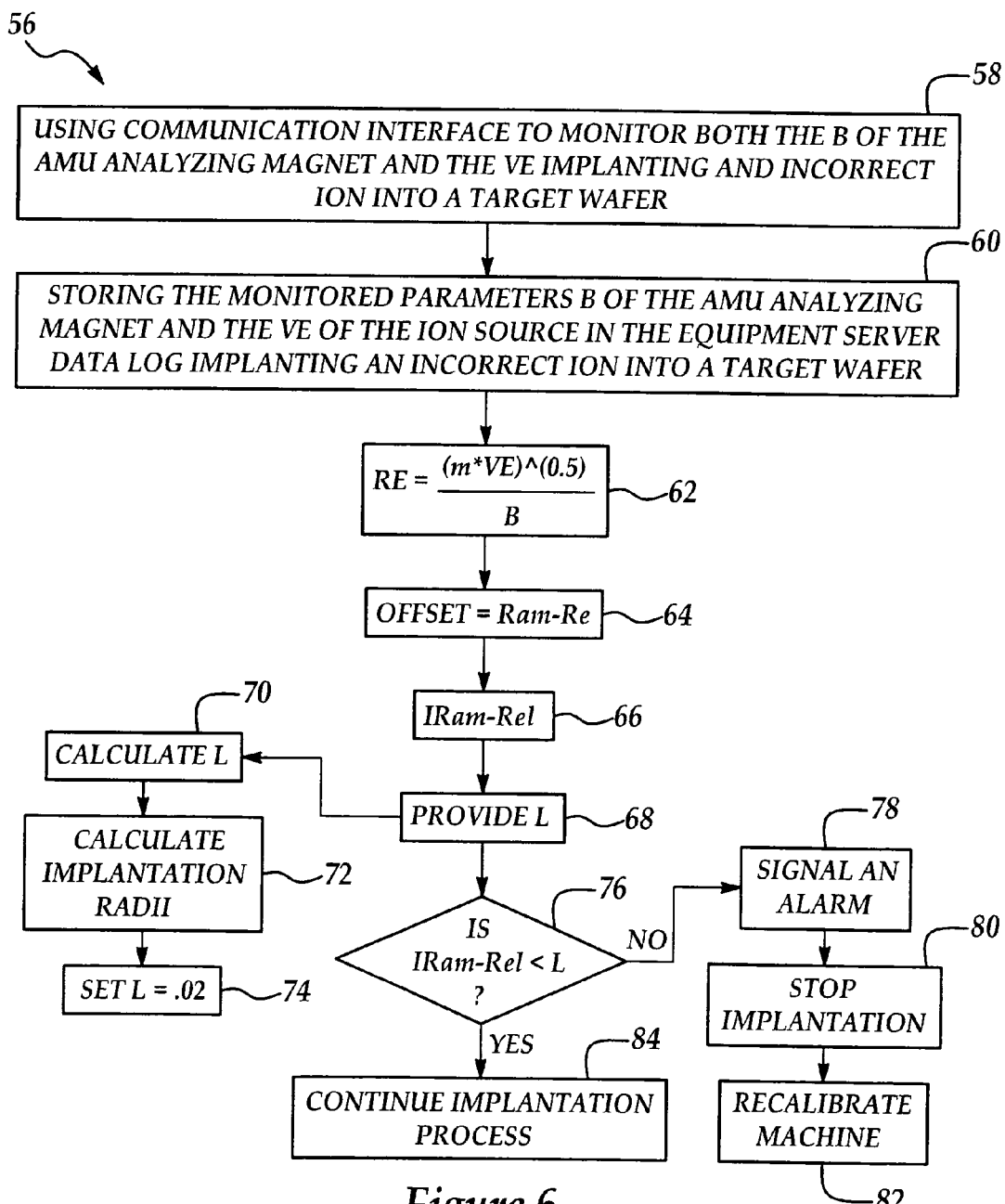

| | $B_{11}$ | | | | | $P_{11}$ | | | | | $BF_{2(49)}$ | | | | |
|---|---|---|---|---|---|---|---|---|---|---|---|---|---|---|---|
| AMU (m) | 10 | 10.5 | 11 | 11.5 | 12 | 30 | 30.5 | 31 | 31.5 | 32 | 48 | 48.5 | 49 | 49.5 | 50 |
| B | 3.4 | 3.5 | 3.6 | 3.7 | 6.1 | 5.8 | 6 | 6 | 6.1 | 6.1 | 7.5 | 7.5 | 7.5 | 7.6 | 7.6 |
| V | 18.22 | 19.33 | 20.39 | 21.50 | 56.80 | 18.57 | 19.94 | 20.00 | 20.64 | 20.61 | 19.80 | 19.78 | 19.87 | 20.49 | 20.47 |
| R | 3.97 | 4.07 | 4.16 | 4.25 | 4.28 | 4.07 | 4.11 | 4.16 | 4.18 | 4.21 | 4.11 | 4.13 | 4.16 | 4.19 | 4.21 |

ION IMPLANTER AND METHOD OF PREVENTING UNDESIRABLE IONS FROM IMPLANTING A TARGET WAFER

FIELD OF THE INVENTION

The present invention generally relates to ion implanters and more particularly, relates to an apparatus and a method for calibrating an interlock for an atomic mass unit in a medium current ion implanter.

BACKGROUND

Ion beam implanters are used to implant or "dope" silicon wafers with impurities to produce n or p type doped regions on the wafers. The n and p type material regions are utilized in the production of semiconductor integrated circuits. Implanting ions generated from source materials such as antimony, arsenic or phosphorus results in n type material. If p type material is desired, ions generated with source materials such as boron, gallium or indium are typically used.

The ion beam implanter includes an ion source for generating positively charged ions from ionizable source materials. The generated ions are formed into a beam an accelerated along a predetermined beam path to an implantation chamber having a target wafer disposed therewithin. The beam is formed and shaped by apparatus located along the beam path en route to the implantation chamber. When operating the implanter, the interior region must be evacuated to reduce the probability of ions being deflected from the predetermined beam path as a result of collisions with air molecules.

As disclosed in Hsu, U.S. Pat. No. 5,886,356, issued on Mar. 23, 1999 which is herein incorporated by reference, the ion source produces a high-density of ions from which the implanter extracts a focused beam of ions and transports the ions to the target wafer.

During ion implantation a surface, such as a target wafer, is uniformly irradiated by a beam of ions or molecules, of a specific species and prescribed energy. The size of the wafer or substrate (e.g. 8 inches or greater) is typically much larger than the cross-section of the irradiating beam which deposits on the wafer as a spot or "ribbon" of about 1 inch. Commonly, in high current machines, the required uniform irradiance is achieved by moving the wafer through the beam.

In a conventional ion implanter 10 such as that shown in FIG. 1, an ion beam 12 is emitted from an ion source 14 and passed through an analyzing magnet 16 having at least one magnetic coil to remove undesired types of ions.

Benveniste, U.S. Pat. No. 5,554,857, issued on Sep. 10, 1996 discloses a method and apparatus for ion beam formation in an ion implanter.

As disclosed in Benveniste, which is herein incorporated by reference, the mass analyzing magnet 16 is positioned along a beam path between the ion source 14 and the implantation chamber deflects ions through controlled arcuate paths to filter ions from the ion beam while allowing certain other ions to enter the ion implantation chamber.

The ion beam current flows through the analyzing magnet coil and generates a magnetic field having a magnetic flux density. Because the ion beam current is proportionate to the magnetic flux density of the magnetic field in the analyzer magnet, a change in beam current will also affect the flux density of the magnetic field of the analyzer magnet. Ions are flow through the analyzing magnet in a circular path in accordance with a right hand rule that is well known in the electromagnetic arts.

Thus, ions having identical energies but different masses experience a different magnetic force as they pass through the magnetic field due to their differing masses thereby altering their pathways. As a result, only those desired ions of a particular atomic mass unit (AMU) are allowed to pass through a pre-positioned orifice in the analyzing magnet 16.

After passing through the mass analyzing magnet the ion beam is accelerated to a desired energy by an accelerator 18. Negative ions are changed into positive ions by a charge exchange process involving collisions with a chemically inert gas such as argon. The positive ions then pass through a post-analyzing magnet (not shown), and a pair of vertical and horizontal scanners 20, 22 finally reach a target wafer 24 where they impact the wafer 24 and are implanted.

However, operation of an ion implanter results in the production of certain contaminant materials. These contaminant materials adhere to surfaces of the implanter beam forming and shaping structure adjacent the ion beam path and also on the surface of the wafer support facing the ion beam. Contaminant materials include undesirable species of ions generated in the ion source, that is, ions having the same atomic mass.

How the AMU calibration device on an ion implanter is calibrated will influence the contamination of ions implanted into a wafer. A calibration error can cause the magnetic coil disposed within the analyzer magnet to select an incorrect ion to implant. An incorrectly implanted ion can cause wafer damage due to scraping of improperly doped wafers.

Typically, a medium current ion implanter is capable of controlling implantation of an ion within +−1 AMU of an AMU of a desired dopant ion. However, a device providing an AMU interlock of less than +−1 is not available in most medium current ion implanter.

A default AMU interlock of +−1 (AMU) can cause pollution when implanting various ions such as a $P_{31}$ ion. For example, a $BF_{30}$ ion having an AMU (30), wherein the AMU (30)=B(11) and F(19), within 1 AMU of the $P_{31}$ ion may be implanted when the $P_{31}$ ion is being implanted. The presence of the $BF_{30}$ ion can occur when gas piping leaks during implantation of a $P_{31}$ ion. Thus, $BF_{30}$ is a pollution source.

As shown in FIG. 2, a normal phosphorus spectrum has a strongest ion beam current at a $P_{31}$ ion having an AMU of 31. However, if a contaminate such as $BF_{30}$ having an AMU within +−1 AMU of the P30 ion is present, then both of the ions may be implanted.

FIG. 3 illustrates a relationship between beam current on the Y-axis and AMU on the X-axis for the ions $P_{31}$ and $BF_{30}$. The desired ion to be implanted is $P_{31}$, having an AMU of 31 has the strongest beam current the closer the $P_{31}$ ion is to the correct AMU of 31. However, if a contaminate ion $BF_{30}$, having an AMU of 30 is also introduced within the analyzer magnet, the beam current is also strong at the AMU of 30 for the $BF_{30}$ ion. Thus, with such a strong beam current for a contaminate ion, it is possible to implant both the $BF_{30}$ and the $P_{31}$ using the implanter used in the prior art having an AMU interlock of +−1 AMU.

Because the magnetic field and magnetic field flux density of the AMU analyzing magnet 16 is directly proportional to the beam current, an adverse change in beam current will also adversely affect the strength of the magnetic field, thus allowing for contamination of undesirable ions.

However, because the AMU of the ions in a traditional implanter may vary by +−1 AMU, it is possible to implant contaminate ions that have a slightly different AMU, within +−1 AMU, than a desired ion to be implanted.

Thus, an object of the present invention to provide a tool to make sure that the implanting ion is the desired ion to be implanted.

Thus, the present invention determines if a desired ion having a fixed AMU is being implanted.

SUMMARY OF THE INVENTION

The present invention provides a real-time response time for measuring and correcting improper processing parameters within an ion implanter within seconds of misoperation.

In general the present invention calculates an estimated real-time radius of a circular path of each of a plurality of ions being implanted into a target wafer using an accurate formula. The formula uses ion implantation processing parameters selected from an extraction voltage of an ion source and a magnetic flux density to calculate the estimated real-time radius. Thus, the estimated real-time radius allows for an interlock on an AMU (m) of each of the plurality of ions being implanted. The AMU interlock assists in preventing wafers from scraping due to incorrect ion implantation of undesirable ions having an AMU different than an AMUs of desired dopant ions.

More particularly, the present invention provides an ion implanter for implanting ions into a target wafer having:
an ion source;
an atomic mass unit (AMU) analyzing magnet having a fixed radius $R_{am}$;
an ion extraction voltage source,
a communication interface adapted to monitor implantation parameters including an extraction voltage $V_E$ of the source of implanting ions and a real-time magnetic flux density B of a magnetic field of the AMU analyzing magnet generated by a beam current flowing through the analyzing magnet,
an equipment server having a data log, wherein the equipment server is in communication with the ion implanter and is in further communication with the communication interface for monitoring parameters communicated from the ion implanter to the equipment server data log during operation of the ion implanter, wherein the parameters are the B and the $V_E$ of the source of implanting ions from the ion implanter.

Additionally, a method of using the ion implanter of the present invention is provided. The method has the steps of:
providing an ion implanter having:
an atomic mass unit analyzing magnet having a radius $R_{am}$, and
a communication interface adapted to monitor implantation parameters including an ion extraction voltage $V_E$ of an ion source of implanting ions and a real-time magnetic flux density B of a magnetic field of the AMU analyzing magnet; and
determining in real-time if an ion implanter is implanting a desired ion into a target wafer.

Preferably, the step of determining in real-time if an ion implanter is implanting a desired ion into a target wafer has the substeps of:
calculating a real-time estimated radius $R_e$ of a circular path for each of a plurality of ions having a desired AMU (m) being implanted;
determining an offset between the $R_{am}$ and the $R_e$ a real-time estimated radius of a circular path of each of a plurality of ions having a desired AMU (m) being implanted ($R_e$);
providing a predetermined radius tolerance level L;
determining if an absolute value of the offset between $R_{am}$ and $R_e$ is greater than the predetermined radius tolerance level L; and
recalibrating the ion implanter if $|R_{am}-R_e|>L$.

BRIEF DESCRIPTION OF THE DRAWINGS

These and other objects, features and advantages of the present invention will become apparent from the following detailed description and the appended drawings in which:

FIG. 1 is an illustration of a prior art ion implanter.

FIG. 2 is a graph illustrating a correlation between a beam current and a normal Phosphorus ion spectrum.

FIG. 3 is a graph illustrating a correlation between a beam current and a Phosphorus ion spectrum contaminated by a $BF_{30}$ ion.

FIG. 4 is an overview of an ion implanter 30.

FIG. 5 is a flowchart depicting steps of a method in accordance with a preferred embodiment of the present invention.

FIG. 6 is a flowchart depicting steps of determining if an ion implanter is implanting a desired ion into a target wafer.

DETAILED DESCRIPTION OF THE PREFERRED EMBODIMENTS

Figures 7, 8:
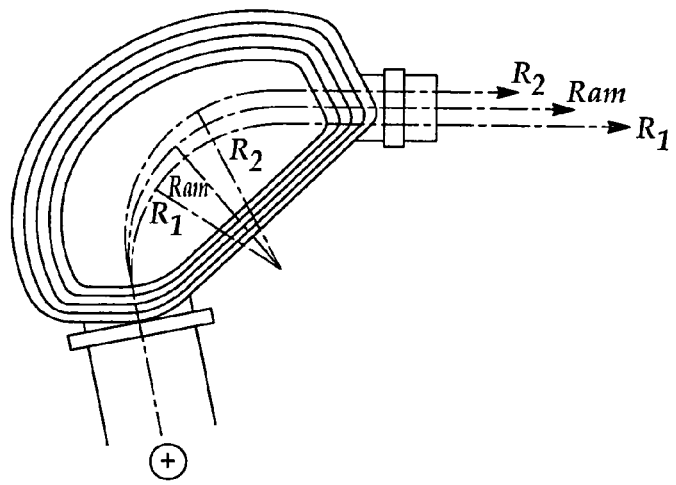
FIG. 7 is an implantation data chart in accordance with a preferred embodiment of the present invention.
FIG. 8 is an enlarged view of an analyzing magnet in accordance with a preferred embodiment the present invention.

The present invention is generally directed to an ion implanter and method of using the ion implanter for implanting proper ions into a target wafer.

Referring now to the drawings, more particularly, FIG. 4 shows an overview of an ion implanter 30 having:
an ion source 32;
an atomic mass unit (AMU) analyzing magnet 34;
an ion extraction voltage source 38;
a communication interface 40 for monitoring implantation parameters; and
an equipment server 44 having a data log 46.

The ion implanter machine in the present embodiment is a model NV-6200 A/AV medium current ion implanter available from Eaton Corporation, Cleveland, Ohio. Other embodiments of the present invention can be adapted to a similarly structured implanter.

The ion implanter atomic mass unit (AMU) analyzing magnet 34 preferably has a fixed radius $R_{am}$ 36. Preferably, as shown in FIG. 8 of an enlarged view of the analyzing magnet 34, the $R_{am}$ 36 is 4.16 cm. However, an alternative ion implanter having an analyzing magnet with a different fixed radius may also be used.

The fixed radius is preferably determined by using a given specification associated with a particular ion implanter, however, the radius may be obtained by taking a physical measurement of the analyzing magnet disposed within the ion implanter.

The ion extraction voltage source 38 provides an adjustable extraction voltage $V_E$ 42, preferably measured in kV, used to extract ions from the ion source 32. Preferably, the ion extraction voltage source 38 is an extraction electrode.

The processing parameters may be selected from an extraction voltage $V_E$ 42 of ion extraction voltage source 38 and a real-time magnetic flux density B 42 of a magnetic field of the AMU analyzing magnet 34 generated by a beam current flowing through the AMU analyzing magnet 34.

The communication interface 40 is adapted to continuously monitor implantation parameters in real-time during an implantation process. The communication interface 40 may be located directly on the ion implanter 30 or may be located at a remote site, wherein the communication interface 40 is in operable electrical communication with the ion implanter 30. The communication interface 40 may be any suitable viewable monitor such as a GUI on a computer monitor screen for displaying a plurality of parameter processing fields.

The equipment server 44 may be a stand-alone computer system having a central processing unit (cpu) to which at least one memory device 50 and the communication interface 40 are in communication with the cpu. Preferably, the equipment server that operates using a standard operating system comparable to Windows® '95 manufactured by Microsoft Corp. Alternatively, the equipment server 44 may be linked to a computer integrated manufacturing (CIM) system that is in communication with a plurality of processing machines (not shown).

Preferably, the equipment server 44 has a data log 46 in communication with the at least one memory device 50 for storing the implantation parameters monitored by the communication interface 40. The equipment server 44 is in communication with the ion implanter 30 and is in further communication with the communication interface 40 for monitoring parameters communicated from the ion implanter 30 to the equipment server data log 46 during operation of the ion implanter 30, wherein the parameters are the B and the $V_E$ of the source of implanting ions from the ion implanter.

The ion implanter 30 further has an arithmetic processor 48 capable of calculating an estimated real-time radius ($R_e$) of ions being implanted by the ion implanter 30. The arithmetic processor 48 is shown in FIG. 4 disposed within the equipment server 44, however the arithmetic processor 48 may also be located in the ion implanter, or in a remote location (not shown). The arithmetic processor 48 may be in communication with a plurality of ion implanters that are linked to a CIM via a local area network (LAN).

The arithmetic processor is capable of solving an equation for the estimated real-time radius ($R_e$) in accordance with the following formula:

$$R_e = \frac{(m*V_E)^{\wedge(0.5)}}{B}$$

wherein $R_e$ is the estimated real-time radius of the circular path of each ion being implanted into the ion implanter 30.

If only the desired ions were implanted, a radius of radius of the circular path of the desired implanting ions would be equal to the fixed radius of the analyzing magnet. Thus, the proper radius for the circular path of desired ions being implanted should be equal to the analyzing magnet fixed radius $R_{am}$.

The determination of whether an improper ion is being implanted is made by comparing the fixed analyzing magnet radius $R_{am}$ with an estimated real-time radius of a circular path of an actual ion being implanted using real time variable processing parameters B and $V_E$ monitored by the communication interface.

Additionally, the ions being implanted using the present embodiment are $B_{11}$, $P_{31}$, and $BF_{2(49)}$. However, a variety of other ions may be implanted using the ion implanter of the present invention. Preferably, an ion having an AMU (m) equal to or less than 50 is desired for implantation to maintain accurate control of the implantation process in accordance with the present invention. Additionally, as shown in FIG. 4, the ion implanter 30 preferably has an acceleration tube 51 and a target or implantation chamber 53 similar to the acceleration tube and implantation chamber disclosed in FIG. 1.

As shown in the flowchart of FIGS. 5, a method 52 of using the ion implanter of the present invention is provided herewithin. The method 52 generally has the steps of:

providing an ion implanter having:
        an atomic mass unit analyzing magnet having a radius $R_{am}$, and
        a communication interface adapted to monitor implantation parameters including an ion extraction voltage ($V_E$) of an ion source of implanting ions and a real-time magnetic field of the AMU analyzing magnet (B) (step 54); and
    determining in real-time if an ion implanter is implanting a desired ion into a target wafer (step 56).

As shown in the flowchart in FIG. 6, the step 56 has substeps 58, 60, 62, 64, 66, 68, 70, 72, 74, 76, 78, 80, 82, 84 as shown in FIG. 6. Initially, the communication interface is used to monitor both the B of the AMU analyzing magnet and the $V_E$ associated with each of the plurality of ions being implanted by the ion implanter (step 58).

Then, the monitored parameters B of the AMU analyzing magnet and the $V_E$ of the ion source associated with each of the plurality of ions being implanted by the ion implanter is stored in the equipment server data log (step 60).

The stored parameters B and $V_E$ are then used to calculate an estimated real-time radius $R_e$ for each of the plurality of ions being implanted (step 62) in accordance with the following equation:

$$R_e = \frac{(m*V_E)^{\wedge(0.5)}}{B}$$

wherein, m=atomic mass unit of a desired ion to be implanted.

An offset between $R_{am}$ and $R_e$ is determined by subtracting $R_e$ from $R_{am}$ (step 64). The absolute value of the calculated offset between $R_{am}$ and $R_e$ is then determined (step 66).

Next, a predetermined radius tolerance level L is provided (step 68). The predetermined radius tolerance level may be calculated using a plurality of monitored implantation data (step 70) to ensure that an AMU of an ion being implanted has less than a 1 AMU, or preferably, less than a 0.5 AMU difference from a desired ion to be implanted. Preferably, the plurality of implantation data includes a plurality of ions each having a predefined AMU (m), wherein each of the plurality of ions is associated with a monitored B and a monitored $V_E$.

While the medium current ion implanter of the present invention is capable of implanting a variety of dopant ions, a current embodiment shown in FIG. 7 illustrates the correlation between three ions $B_{11}$, $P_{31}$, and $BF_{2(49)}$, respectively and associated monitored processing values including a predefined AMU (m) of each ion, a monitored $V_E$ of each ion being implanted, and a monitored B associated with each ion, wherein the B is set according to recipe.

As shown in FIG. 7, a plurality of implantation radii associated with each of the plurality of ions each having predefined AMUs were calculated using the formula for $R_e$ (step 72).

A radius corresponding to the proper AMU of ion $B_{11}$, $P_{31}$, and $BF_{2(49)}$ equals the $R_{am}$ of the analyzing magnet, i.e. 4.16 cm. Additionally, a plurality of radii were calculated using a +−0.5 AMU and a +−1 AMU difference from the proper AMU for each ion. As is shown in FIG. 7, even a +−0.5 AMU change in the AMU of each ion adversely affects the radius of each ion, even though the +−0.5 AMU change is a tighter tolerance than the +−1 AMU interlock provided in the traditional ion implanter.

Thus, a tighter predetermined radius tolerance level, that allows for less than a +−0.5 AMU difference between a desired ion to be implanted an undesirable ion is needed.

The absolute value of the calculated radius offset between a $B_{11}$ and a $B_{10.5}$ ion is |4.16 cm−4.07 cm|=0.16 cm, additionally, the absolute value of the calculated radius offset between a desired $B_{11}$ ion and an undesired $B_{11.5}$ ion is |4.16 cm−4.25 cm|=0.09 cm. Thus, a tighter predetermined radius tolerance level L less than 0.09 cm is needed to prevent implantation of an undesirable ion having an AMU within at least 0.5 of an AMU of a desired ion to be implanted.

Similar calculations can be performed to determine the absolute value of the offset for radii using the $P_{31}$ and the $BF_{2(49)}$ ions. As is shown for the $BF_{2(49)}$ ion, an absolute value of a radius offset of 0.03 cm ($|R_{BF2(49)}4.16\ cm-R_{BF2(49.5)}4.19\ cm|$) still allows for a variance of 0.5 AMUs between an ion having an AMU of 49.5 and a $BF_{2(49)}$ ion. A tighter radius tolerance level, less than a 4.16 cm+−0.03 cm, is needed to provide an ion having an AMU less than a 0.5 difference than a desired ion AMU.

Thus, as shown in the implantation data chart of FIG. 7, the desired predetermined radius tolerance level L using the present embodiment is set at least equal to 0.02 cm (step 74).

Thus, the estimated real-time radius $R_e$ of an ion being implanted should not vary more than 0.02 cm from the radius of the analyzing magnet ($R_{am}$). However, it is contemplated that a different predetermined radius tolerance level L may be calculated in a similar manner using a different ion implanter having a different fixed radius $R_{am}$ of the analyzing magnet.

Therefore, in accordance with a preferred embodiment, a radius of an ion being implanted should be within the following range (4.16 cm−0.02 cm)=<$R_e$=<(4.16 cm+0.02 cm),i.e. 4.14 cm<$R_e$<4.16 cm, or $R_e$=<0.02 cm. If $R_e$ is outside of the predetermined radius tolerance level L, then, the AMU of the ion being implanted has an AMU that varies at least 0.5 AMU's from a desired ion's AMU. Such a variation in AMU of an ion AMU from a desired ion AMU means that an incorrect is present and thus, should be separated from the desired ion using the analyzing magnet.

The absolute value of the calculated offset between $R_{am}$ and $R_e$ is compared with the predetermined radius tolerance level L to determine whether the absolute value of the offset between $R_{am}$ and $R_e$ is greater than the predetermined radius tolerance level L (step 76).

If an absolute value of the offset between $R_{am}$ and $R_e$ is greater than a predetermined radius tolerance level L, then, an undesirable ion having a circular radius that exceeds L is being incorrectly implanted. Thus, an estimated radius for the circular path of the desired ion being implanted should not vary more than a predefined tolerance limit L from the $R_{am}$ to maintain accuracy within the implantation process.

FIG. 8 illustrates an enlarged view of an analyzer magnet having a fixed radius $R_{am}$. As shown in FIG. 8, heavier ions that have a radius $R_1$ that exceeds the $R_{am}$, 4.16 cm are deflected away from the beam current flowing through the analyzer magnet above the radius of the analyzing magnet towards a wall of the analyzer magnet. Additionally, lighter ions that have a radius $R_2$ that is less the $R_{am}$, 4.14 cm are deflected away from the beam current flowing through the analyzer magnet below the radius of the analyzing magnet towards a wall of the analyzer magnet.

In a preferred embodiment of the present invention, if $|R_{am}-R_e|>L$, then an alarm is signaled to alert an operator or responsible engineer that there is a problem with the implantation process (step 78). In an alternative embodiment, the implantation process can be stopped (step 80) and the machine can be recalibrated to prevent undesirable ions from being implanted into a target wafer if $|R_{am}-R_e|>L$ (step 82).

If $|R_{am}-R_e|<L$, then the implantation process should continue (step 84).

From the foregoing, it should be appreciated that an ion implanter and method of use that operates to prevent implantation of undesirable ions into a target wafer is provided.

While a preferred exemplary embodiment has been presented in the foregoing detailed description, it should be understood that a vast number of variations exist and this preferred exemplary embodiment is merely an example, and it is not intended to limit the scope, applicability or configuration of the invention in any way. Rather, the foregoing detailed description provides those of ordinary skill in the art with a convenient guide for implementing a preferred embodiment of the invention and various changes can be made in the function and arrangements of the exemplary embodiment without departing from the spirit and scope of the appended claims.

What is claimed is:

1. An ion implanter for implanting ions into a target wafer comprising:
   an ion source;
   an atomic mass unit (AMU) analyzing magnet having a fixed radius $R_{am}$;
   an ion extraction voltage source,
   a communication interface adapted to monitor implantation parameters including an extraction voltage $V_E$ of the source of implanting ions and a real-time magnetic flux density B of a magnetic field of the AMU analyzing magnet generated by a beam current flowing through the analyzing magnet,
   an equipment server having a data log, wherein the equipment server is in communication with the ion implanter and is in further communication with the communication interface for monitoring parameters communicated from the ion implanter to the equipment server data log during operation of the ion implanter, wherein the parameters are the B and the $V_E$ of the source of implanting ions from the ion implanter, wherein the ion implanter uses a plurality of implantation data to ensure that an AMU of an ion being implanted has less than a 0.5 AMU difference from an AMU of a desired ion to be implanted, wherein the plurality of implantation data is selected from data relating to a plurality of ions each having predefined AMUs, each of the plurality of ions associated with a monitored B and a monitored $V_E$;

means for calculating an estimated radius $R_e$ of ions being implanted by the ion implanter;

means for determining an offset value between $R_{am}$ and $R_e$;

and means for signaling an alarm if the absolute value of the offset, $|R_{am}-R_e|$, is larger than a predetermined radius tolerance level L.

2. The ion implanter of claim 1 wherein an atomic mass unit of a desired ion being implanted (m) using the implanter is less than 50 atomic mass units.

3. The ion implanter of claim 1 wherein the means for calculating being located in at least one of the ion implanter, the equipment server, and a remote device in communication with the equipment server.

4. The ion implanter of claim 3, wherein the means for calculating is an arithmetic processor capable of solving an equation for $R_e$ in accordance with the following equation:

$$R_e = \frac{(m*V_E)^{\wedge(0.5)}}{B}$$

wherein m=the atomic mass of a desired ion to be implanted.

5. A method of using an ion implanter, the method comprising the step of:

providing an ion implanter having:
an atomic mass unit analyzing magnet having a radius $R_{am}$, and
a communication interface adapted to monitor implantation parameters including an ion extraction voltage $V_E$ of an ion source of implanting ions and a real-time magnetic flux density B of a magnetic field of the AMU analyzing magnet; and determining in real-time if an ion implanter is implanting a desired ion into a target wafer;

determining an offset between the $R_{am}$ and a estimated radius of a circular path of each of a plurality of ions having a desired AMU (m) being implanted ($R_e$);

providing a predetermined radius tolerance level L
using a plurality of implantation data to ensure that an AMU of an ion being implanted has less than a 0.5 AMU difference from an AMU of a desired ion to be implanted, wherein the plurality of implantation data is selected from data relating to a plurality of ions each having predefined AMUs, each of the plurality of ions associated with a monitored B and a monitored $V_E$;

calculating a plurality of implantation radii associated with each of the plurality of ions each having predefined AMUs and signaling an alarm if any of the absolute values of the offset between $R_{am}$ and $R_e$ is larger than the predetermined radius tolerance level L.

6. The method of claim 5, further comprising the step of: setting a predefined radius tolerance level equal to 0.02 cm.

7. The method of claim 5, further comprising the steps of: using the communication interface to monitor both the B of the AMU analyzing magnet and the $V_E$ of the ion source associated with each of the plurality of ions being implanted by the ion implanter;

storing the monitored parameters B of the AMU analyzing magnet and the $V_E$ of the ion source associated with each of the plurality of ions being implanted by the ion implanter in the equipment server data log; and using the stored parameters B and $V_E$ to calculate the Re.

8. The method of claim 7, wherein the step of using the stored parameters B and $V_E$ to calculate the Re further comprises the step of:

solving for the $R_e$ in accordance with the following formula $$R_e = \frac{(m*V_E)^{\wedge(0.5)}}{B}$$

wherein m=atomic mass unit of a desired ion to be implanted.

9. The method of claim 5 further comprising the step of: stopping operation of the ion implanter if $|R_{am}-R_e|>L$.

10. A method of using an ion implanter, the method comprising the step of:

providing an ion implanter having:
an atomic mass unit analyzing magnet having a radius $R_{am}$, and
a communication interface adapted to monitor implantation parameters including an ion extraction voltage $V_E$ of an ion source of implanting ions and a real-time magnetic flux density B of a magnetic field of the AMU analyzing magnet;

calculating a real-time estimated radius $R_e$ of a circular path for each of a plurality of ions having a desired AMU (m) being implanted;

determining an offset between the $R_{am}$ and the $R_e$ a real-time estimated radius of a circular path of each of a plurality of ions having a desired AMU (m) being implanted ($R_e$);

using a plurality of implantation data to ensure that an AMU of an ion being implanted has less than a 0.5 AMU difference from an AMU of a desired ion to be implanted, wherein the plurality of implantation data is selected from data relating to a plurality of ions each having predefined AMUs, each of the plurality of ions associated with a monitored B and a monitored $V_E$;

providing a predetermined radius tolerance level L;

determining if an absolute value of the offset between $R_{am}$ and $R_e$ is greater than the predetermined radius tolerance level L; and recalibrating the ion implanter if $|R_{am}-R_e|>L$.

11. The method of claim 10, wherein the step of calculating $R_e$ is performed in accordance with the following equation:

$$R_e = \frac{(m*V_E)^{\wedge(0.5)}}{B}$$

wherein m=atomic mass unit of a desired ion to be implanted.

12. A method of using an ion implanter, the method comprising the step of:

providing an ion implanter having:
an atomic mass unit analyzing magnet having a radius $R_{am}$, and
a communication interface adapted to monitor implantation parameters including an ion extraction voltage $V_E$ of an ion source of implanting ions and a real-time magnetic flux density B of a magnetic field of the AMU analyzing magnet;

determining in real-time if an ion implanter is implanting a desired ion into a target wafer;

determining an offset between the $R_{am}$ and a real-time estimated radius of a circular path of each of a plurality of ions having a desired AMU (m) being implanted ($R_e$);

providing a predetermined radius tolerance level L; and determining if an absolute value of the offset between $R_{am}$ and $R_e$ is greater than the predetermined radius tolerance level L; and signaling an alarm if $|R_{am}-R_e|>L$.

13. A method of using an ion implanter, the method comprising the step of:

provding an ion implanter having:

an atomic mass unit analyzing magnet having a radius $R_{am}$, and a communication interface adapted to monitor implantation parameters including an ion extraction voltage $V_E$ of an ion source of implanting ions and a real-time magnetic flux density B of a magnetic field of the AMU analyzing magnet;

determining in real-time if an ion implanter is implanting a desired ion into a target wafer;

determining an offset between the $R_{am}$ and a real-time estimated radius of a circular path of each of a plurality of ions having a desired AMU (m) being implanted (Re);

providing a predetermined radius tolerance level L; and determining if an absolute value of the offset between $R_{am}$ and $R_e$ is greater than the predetermined radius tolerance level L; and stopping operation of the ion implanter if $|R_{am}-R_e|>L$.

* * * * *